United States Patent
Jang et al.

(10) Patent No.: US 6,387,775 B1
(45) Date of Patent: May 14, 2002

(54) FABRICATION OF MIM CAPACITOR IN COPPER DAMASCENE PROCESS

(75) Inventors: Syun-Ming Jang; Mong-Song Liang, both of Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/835,025

(22) Filed: Apr. 16, 2001

(51) Int. Cl.[7] ............................................... H01L 21/20
(52) U.S. Cl. .................... 438/396; 438/250; 438/393
(58) Field of Search ........................... 438/396, 3, 239, 438/240, 393, 725, 735, 738, 780

(56) References Cited

U.S. PATENT DOCUMENTS

| | | | |
|---|---|---|---|
| 5,918,135 A | 6/1999 | Lee et al. .................. | 438/393 |
| 5,946,567 A | 8/1999 | Weng et al. ............... | 438/250 |
| 6,001,702 A | 12/1999 | Cook et al. ............... | 438/393 |
| 6,072,210 A | 6/2000 | Choi ........................ | 257/303 |
| 6,261,951 B1 * | 7/2001 | Buchwalter et al. | |
| 6,278,147 B1 * | 8/2001 | Dalton et al. | |
| 6,284,149 B1 * | 9/2001 | Li et al. ..................... | 438/710 |
| 6,284,619 B1 * | 9/2001 | Seymour et al. .......... | 438/396 |

* cited by examiner

*Primary Examiner*—Tuan H. Nguyen
(74) *Attorney, Agent, or Firm*—George O. Saile; Stephen B. Ackerman; Stephen G. Stanton

(57) ABSTRACT

A method for forming an MIM capacitor, comprising the following steps. A semiconductor structure having an exposed lower metal damascene is provided. A capacitor layer is formed over the semiconductor structure and the exposed lower metal damascene. An organic etch stop layer is formed upon the capacitor layer. An IMD layer is formed upon the organic etch stop layer. The IMD layer is etched with a first etch highly selective to the IMD layer as compared to the organic etch stop layer, to form an IMD trench exposing a portion of the organic etch stop layer. The exposed portion of the organic etch stop layer is etched with a second etch method highly selective to the exposed portion of the organic etch stop layer as compared to the capacitor layer, to expose a portion of the capacitor layer. An upper metal damascene is formed upon the exposed portion of the capacitor layer and within the IMD trench to complete formation of the MIM capacitor.

30 Claims, 2 Drawing Sheets

FABRICATION OF MIM CAPACITOR IN COPPER DAMASCENE PROCESS

FIELD OF THE INVENTION

The present invention relates generally to methods of fabricating microelectronic devices and specifically to methods of fabricating metal-insulator-metal (MIM) capacitors.

BACKGROUND OF THE INVENTION

Fabrication of metal/insulator/metal (MIM) capacitors in copper (Cu) damascene is very challenging because a trench must be formed on the capacitor and the control of the capacitor thickness is difficult.

U.S. Pat. No. 5,946,567 to Weng et al and U.S. Pat. No. 6,001,702 to Cook et al. each describe processes for the fabrication of MIM capacitors.

U.S. Pat. No. 6,072,210 to Choi describes a capacitor process using a copper electrode.

U.S. Pat. No. 5,918,135 to Lee et al. describes a MIM capacitor fabrication process.

SUMMARY OF THE INVENTION

Accordingly, it is an object of the present invention to provide a method of fabricating an MIM capacitor while preserving the dielectric capacitor during the trench etch.

Another object of the present invention is to provide a method of fabricating an MIM capacitor with precise control of capacitor thickness with the associated capacitance.

Other objects will appear hereinafter.

It has now been discovered that the above and other objects of the present invention may be accomplished in the following manner. Specifically, a semiconductor structure having an exposed lower metal damascene is provided. A capacitor layer is formed over the semiconductor structure and the exposed lower metal damascene. An organic etch stop layer is formed upon the capacitor layer. An IMD layer is formed upon the organic etch stop layer. The IMD layer is etched with a first etch highly selective to the IMD layer as compared to the organic etch stop layer, to form an IMD trench exposing a portion of the organic etch stop layer. The exposed portion of the organic etch stop layer is etched with a second etch method highly selective to the exposed portion of the organic etch stop layer as compared to the capacitor layer, to expose a portion of the capacitor layer. An upper metal damascene is formed upon the exposed portion of the capacitor layer and within the IMD trench to complete formation of the MIM capacitor.

BRIEF DESCRIPTION OF THE DRAWINGS

The present invention will be more clearly understood from the following description taken in conjunction with the accompanying drawings in which like reference numerals designate similar or corresponding. elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
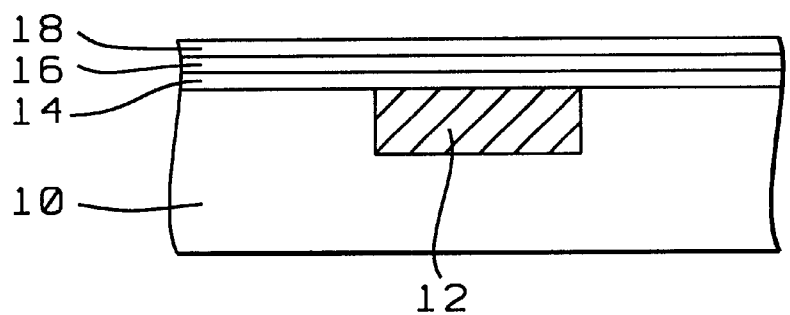
FIGS. 1 to 6 illustrate the preferred embodiment of the present invention.

As shown in FIG. 1, semiconductor structure 10 has exposed lower metal damascene structure 12 that is preferably comprised of copper (Cu).

Diffusion barrier 14 may be formed over semiconductor structure 10 and lower Cu damascene 12 that is preferably formed of SiN/SiC. Barrier layer 14 is preferably from about 200 to 400 Å thick, and is more preferably from about 250 to 350 Å thick.

Capacitor layer 16 is then formed over diffusion barrier layer 14 to a thickness of from about 200 to 500 Å, and more preferably from about 300 to 400 Å. Capacitor 16 is preferably formed of undoped silicate glass (USG) or another high dielectric constant (high-k) material, mostly inorganic, such as $Ta_2O_5$, or $ZrO_2$, etc., and is more preferably formed of $Al_2O_3$.

A thin organic etch stop layer 18 is then formed over high-k capacitor layer 16 to a thickness of from about 150 to 250 Å, and more preferably from about 175 to 225 Å. Organic etch stop layer 18 is preferably formed of a low-k organic polymer such as polyimide, benzocyclo-butane, polyarylene ethers or polynorbornenes, and is more preferably polyarylene ethers.

Formation of Inter-Metal Dielectric Layer

Figure 2:
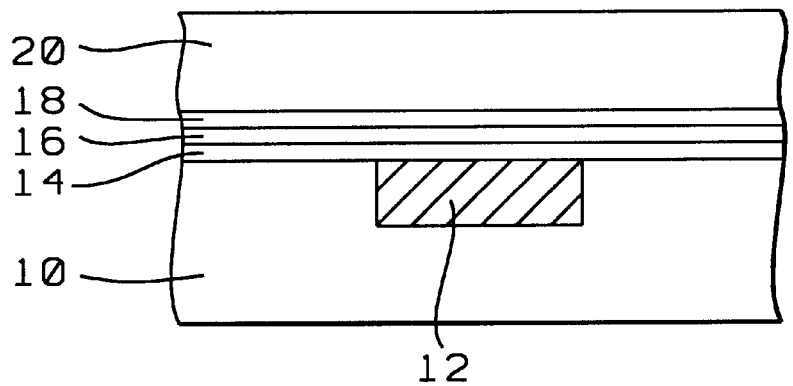

As shown in FIG. 2, inter-metal dielectric (IMD) layer 20 is formed over thin organic etch stop layer 18 to a thickness of from about 4000 to 7000 Å, and more preferably from about 5000 to 6000 Å. IMD layer 20 is preferably formed mostly of USG, FSG or carbon doped silica glass, and is preferably mostly USG.

Formation of Patterned Photoresist Layer

Figure 3:
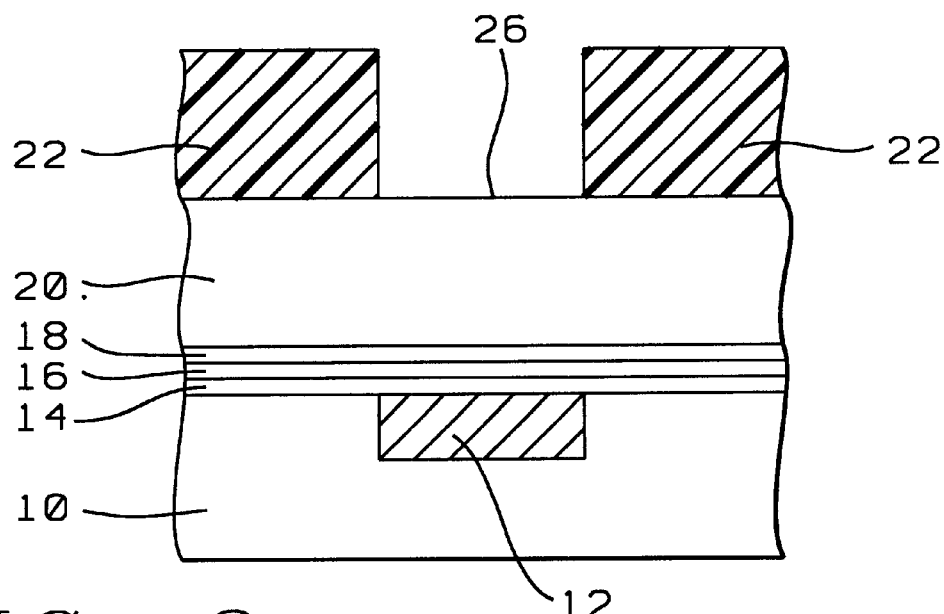

As shown in FIG. 3, patterned photoresist layer 22 is formed over IMD layer 20 defining opening 24 exposing a portion 26 of IMD layer 20. Photoresist layer 22 is preferably formed by a spin-on coating technique.

Formation of IMD Trench with First Etch Method

Figure 4:
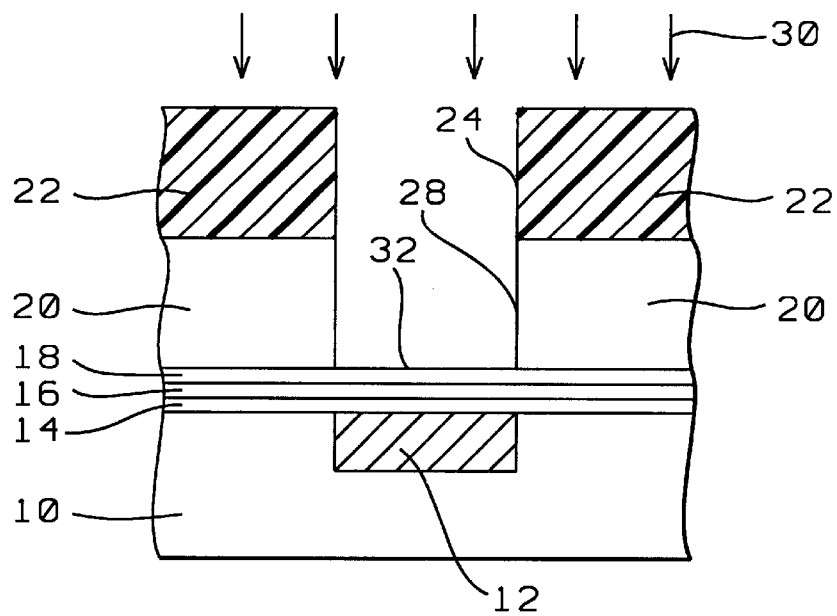

As shown in FIG. 4, using patterned photoresist layer 22 as a mask, IMD layer 20 is etched/patterned with a first etch method 30 to form IMD trench 28, with first etch 30 stopping on low-k polymer organic etch stop layer 18, exposing portion 32 of low-k polymer organic etch stop layer 18. First etch 30 is selective such that the IMD layer (oxide):low-k polymer organic etch stop layer is preferably from about 27:1 to 33:1 and more preferably greater than about 30:1, i.e. IMD layer 20 is etched at a rate that is preferably greater than 30 times faster than low-k polymer organic etch stop layer 18.

First etch method 30 uses an etch preferably comprised of a fluorocarbon such as $C_4F_8$, $CHF_3$, $CF_4$, $CH_2F_2$, or a combination thereof, and is more preferably $C_4F$. Also argon (Ar) may be used in conjunction with the fluorocarbon, e.g. $CF_4/Ar$, $CH_2F_2/Ar$, etc.

Figure 5:
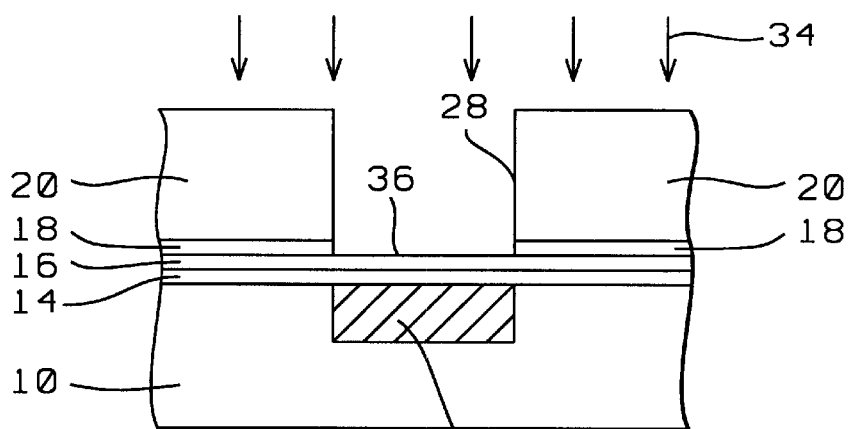

Etching of Exposed Portion of Low-k Polymer Etch Stop Layer with the Stripping of Patterned Photoresist Layer As shown in FIG. 5, the etch chemistry is changed and, using patterned IMD layer 20 as a mask, second etch method 34 is used to etch exposed portion 32 of low-k polymer organic etch stop layer 18 with second etch 34 stopping on high-k capacitor 16, exposing portion 36 of capacitor 16. Second etch 34 also simultaneously etches/strips patterned photoresist layer 22. Second etch 24 is selective such that the low-k polymer organic etch stop layer : high-k capacitor layer is preferably from about 27:1 to 33:1 and more preferably about 30:1, i.e. low-k polymer organic etch stop layer 18 is etched at a rate that is preferably greater than 30 times faster than high-k capacitor layer 16.

Second etch method 34 uses an etch preferably comprised of $O_2/N_2$, $O_2$, $N_2$, or $H_2/N_2$, and more preferably $O_2/N_2$.

It is noted that by using capacitor layer 16 as an etch stop with a highly selective first etch 30 and second etch 34, a good thickness control of capacitor layer 16 is achieved. Also, no polish stop is required.

Formation of Upper Copper Damascene

Figure 6:
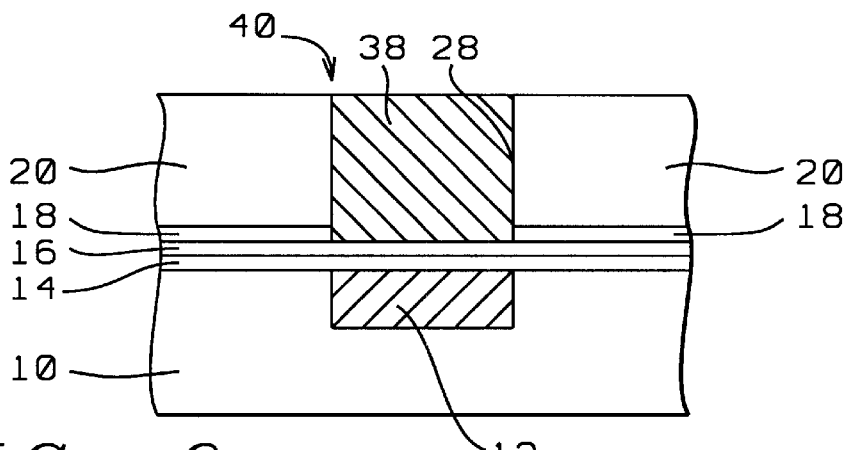

As shown in FIG. 6, upper metal damascene structure 38 is formed within IMD trench 28 upon exposed portion 36 of capacitor 16 to complete formation of MIM capacitor 40 (metal 38—insulator 16—metal 12). Upper metal damascene structure 38 is preferably a copper damascene.

Advantages of the Present Invention

The advantages of the present invention include:

1) good capacitor thickness and capacitance control is achieved for the MI capacitor, that is due to the high selectively (preferably greater than about 30:1) of oxide (IMD) to low-k polymer (etch stop), the loss of capacitor 16 is minimized or eliminated thus precise control of capacitor 16 thickness and capacitance is achieved; and 2) no polish stop layer is required.

While particular embodiments of the present invention have been illustrated and described, it is not intended to limit the invention, except as defined by the following claims.

We claim:

1. A method for forming an MIM capacitor, comprising the steps;

providing a semiconductor structure having an exposed lower metal damascene;

forming a capacitor layer over the semiconductor structure and the exposed lower metal damascene;

forming an organic etch stop layer upon the capacitor layer;

forming an IMD layer upon the organic etch stop layer;

patterning the IMD layer using a first etch method highly selective to the IMD layer as compared to the organic etch stop layer, to form an IMD trench exposing a portion of the organic etch stop layer;

etching the exposed portion of the organic etch stop layer with a second etch method highly selective to the exposed portion of the organic etch stop layer as compared to the capacitor layer, to expose a portion of the capacitor layer; and forming an upper metal damascene upon the exposed portion of the capacitor layer and within the IMD trench to complete formation of the MIM capacitor.

2. The method of claim 1, including the step of forming a diffusion barrier layer upon the semiconductor structure and the exposed lower metal damascene; wherein the capacitor layer is formed over the diffusion barrier layer.

3. The method of claim 1, including the step of forming a SiN/SiC diffusion barrier layer upon the semiconductor structure and the exposed lower metal damascene; wherein the capacitor layer is formed over the diffusion barrier layer; the lower metal damascene being comprised of copper and the capacitor layer being comprised of a material selected from the group consisting of USG, $Ta_2O_5$, and $ZrO_2$.

4. The method of claim 1, wherein the exposed lower metal damascene is comprised of copper; the capacitor layer is comprised of a high-k mostly inorganic material selected from the group consisting of USG, $Ta_2O_5$, and $ZrO_2$; the organic etch stop layer is a low-k organic polymer; the IMD layer is comprised of a material selected from the group consisting of USG, FSG and carbon doped silica glass; and the upper metal damascene is comprised of copper.

5. The method of claim 1, wherein the capacitor layer is from about 200 to 500 Å thick; the organic etch stop layer is from about 150 to 250 Å; the IMD layer is from about 4000 to 7000 Å thick.

6. The method of claim 1, wherein the capacitor layer is from about 300 to 400 Å thick; the organic etch stop layer is from about 175 to 225 Å; the IMD layer is from about 5000 to 6000 Å thick.

7. The method of claim 1, wherein the first etch method is comprised of an etch selected from the group consisting of $C_4F_8$, $CHF_3$, $CF_4$, $CH_2F_2$ and a combination thereof; and the second etch method is comprised of an etch selected from the group consisting of $O_2/N_2$, $O_2$, $N_2$ and $H_2/N_2$.

8. The method of claim 1, wherein the first etch method is comprised of a $C_4F_8$ etch; and the second etch method is comprised of a $O_2/N_2$ etch.

9. The method of claim 1, wherein the first etch method has an oxide: organic etch stop layer selectivity of from about 27:1 to 33:1; and the second etch method has a organic etch stop layer: capacitor layer selectivity of from about 27:1 to 33:1.

10. The method of claim 1, wherein the first etch method has an oxide: organic etch stop layer selectivity of greater than about 30:1; and the second etch method has a organic etch stop layer: capacitor layer selectivity of greater than about 30:1.

11. A method for forming an MIM capacitor, comprising the steps;

providing a semiconductor structure having an exposed lower copper damascene;

forming a high-k capacitor layer over the semiconductor structure and the exposed lower copper damascene;

forming a low-k organic etch stop layer upon the high-k capacitor layer;

forming an JMD layer upon the low-k organic etch stop layer;

etching the IMD layer with a first etch highly selective to the IMD layer as compared to the low-k organic etch stop layer, to form an IMD trench exposing a portion of the low-k organic etch stop layer;

etching the exposed portion of the low-k organic etch stop layer with a second etch method highly selective to the exposed portion of the low-k organic etch stop layer as compared to the high-k capacitor layer, to expose a portion of the high-k capacitor layer; and forming an upper copper damascene upon the exposed portion of the high-k capacitor layer and within the IMD trench to complete formation of the MIM capacitor.

12. The method of claim 11, including the step of forming a diffusion barrier layer upon the semiconductor structure and the exposed lower copper damascene; wherein the capacitor layer is formed over the diffusion barrier layer.

13. The method of claim 11, including the step of forming a SiN/SiC diffusion barrier layer upon the semiconductor structure and the exposed lower copper damascene; wherein the capacitor layer is formed over the.diffusion barrier layer; the capacitor layer being comprised of a material selected from the group consisting of USG, $Ta_2O_5$, and $ZrO_2$.

14. The method of claim 11, wherein the capacitor layer is comprised of a high-k mostly inorganic material selected from the group consisting of USG, $Ta_2O_5$, and $ZrO_2$; the organic etch stop layer is a low-k organic polymer; and the IMD layer is comprised of a material selected from the group consisting of USG, FSG and carbon doped silica glass.

15. The method of claim 11, wherein the capacitor layer is from about 200 to 500 Å thick; the organic etch stop layer is from about 150 to 250 Å; the IMD layer is from about 4000 to 7000 Å thick.

16. The method of claim 11, wherein the capacitor layer is from about 300 to 400 Å thick; the organic etch stop layer is from about 175 to 225 Å; the IMD layer is from about 5000 to 6000 Å thick.

17. The method of claim 11, wherein the first etch method is comprised of an etch selected from the group consisting of $C_4F_8$, $CHF_3$, $CF_4$, $CH_2F_2$ and a combination thereof; and the second etch method is comprised of an etch selected from the group consisting of $O_2/N_2$, $O_2$, $N_2$ and $H_2/N_2$.

18. The method of claim 11, wherein the first etch method is comprised of a $C_4F_8$ etch; and the second etch method is comprised of a $O_2/N_2$ etch.

19. The method of claim 11, wherein the first etch method has an oxide:organic etch stop layer selectivity of from about 27:1 to 33:1; and the second etch method has a organic etch stop layer:capacitor layer selectivity of from about 27:1 to 33:1.

20. The method of claim 11, wherein the first etch method has an oxide:organic etch stop layer selectivity of greater than about 30:1; and the second etch method has a organic etch stop layer: capacitor layer selectivity of greater than about 30:1.

21. A method for forming an MIM capacitor, comprising the steps;

providing a semiconductor structure having an exposed lower metal damascene;

forming a capacitor layer over the semiconductor structure and the exposed lower metal damascene;

forming an organic etch stop layer upon the capacitor layer;

forming an IMD layer upon the organic etch stop layer;

forming a photoresist layer upon the IMD layer;

patterning the photoresist layer to form a patterned photoresist mask layer having a photoresist layer opening exposing a portion of IMD layer;

etching the exposed IMD layer portion using a first etch method highly selective to the IMD layer as compared to the organic etch stop layer, to form an IMD trench exposing a portion of the organic etch stop layer;

etching the exposed portion of the organic etch stop layer with a second etch method highly selective to the exposed portion of the organic etch stop layer as compared to the capacitor layer, to expose a portion of the capacitor layer and simultaneously removing the patterned photoresist layer; and forming an upper metal damascene upon the exposed portion of the capacitor layer and within the IMD trench to complete formation of the MIM capacitor.

22. The method of claim 21, including the step of forming a diffusion barrier layer upon the semiconductor structure and the exposed lower metal damascene; wherein the capacitor layer is formed over the diffusion barrier layer.

23. The method of claim 21, including the step of forming a SiN/SiC diffusion barrier layer upon the semiconductor structure and the exposed lower metal damascene; wherein the capacitor layer is formed over the diffusion barrier layer; the lower metal damascene being comprised of copper and the capacitor layer being comprised of a material selected from the group consisting of USG, $Ta_2O_5$, and $ZrO_2$.

24. The method of claim 21, wherein the exposed lower metal damascene is comprised of copper; the capacitor layer is comprised of a high-k mostly inorganic material selected from the group consisting of USG, $Ta_2O_5$, and $ZrO_2$; the organic etch stop layer is a low-k organic polymer; the IMD layer is comprised of a material selected from the group consisting of USG, FSG and carbon doped silica glass; and the upper metal damascene is comprised of copper.

25. The method of claim 21, wherein the capacitor layer is from about 200 to 500 Å thick; the organic etch stop layer is from about 150 to 250 Å; the IMD layer is from about 4000 to 7000 Å thick.

26. The method of claim 21, wherein the capacitor layer is from about 300 to 400 Å thick; the organic etch stop layer is from about 175 to 225 Å; the IMD layer is from about 5000 to 6000 Å thick.

27. The method of claim 21, wherein the first etch method is comprised of an etch selected from the group consisting of $C_4F_8$, $CHF_3$, $CF_4$, $CH_2F_2$ and a combination thereof; and the second etch method is comprised of an etch selected from the group consisting of $O_2/N_2$, $O_2$, $N_2$ and $H_2/N_2$.

28. The method of claim 21, wherein the first etch method is comprised of a $C_4F_8$ etch; and the second etch method is comprised of a $O_2/N_2$ etch.

29. The method of claim 21, wherein the first etch method has an oxide:organic etch stop layer selectivity of from about 27:1 to 33:1; and the second etch method has a organic etch stop layer :capacitor layer selectivity of from about 27:1 to 33:1.

30. The method of claim 21, wherein the first etch method has an oxide:organic etch stop layer selectivity of greater than about 30:1; and the second etch method has a organic etch stop layer:capacitor layer selectivity of greater than about 30:1.

* * * * *